United States Patent [19]

Shibuya et al.

[11] Patent Number: 4,746,900
[45] Date of Patent: May 24, 1988

[54] SIGNAL PROCESSING CIRCUIT

[75] Inventors: Toshifumi Shibuya, Tokohama; Hiroshi Endoh, Toyokawa; Yoshimi Iso, Yokohama; Takao Arai, Yokohama; Hiroo Okamoto, Yokohama, all of Japan

[73] Assignee: Hitachi, Ltd., Tokyo, Japan

[21] Appl. No.: 938,965

[22] Filed: Dec. 8, 1986

[30] Foreign Application Priority Data

Dec. 6, 1985 [JP] Japan .............................. 60-273219
Feb. 7, 1986 [JP] Japan .............................. 61-23712

[51] Int. Cl.⁴ ............................................ H03M 1/50
[52] U.S. Cl. ...................... 340/347 AD; 340/347 NT
[58] Field of Search ................. 340/347 AD, 347 NT; 360/32

[56] References Cited

U.S. PATENT DOCUMENTS 4,092,726 5/1978 Schoeff .................. 340/347 NT

Primary Examiner—Charles D. Miller
Attorney, Agent, or Firm—Antonelli, Terry & Wands

[57] ABSTRACT

An integration type D/A and A/D converter having improved linearity and low power consumption. Logic circuits such as ECL counters consuming a major part of power of the D/A and A/D converters are realized through CMOS process. Current source circuits, current switch circuit and comparator circuit of the integration type A/D converter are realized in IC through bipolar process ensuring high accuracy and low noise. Logic parts such as counter is realized through CMOS process.

9 Claims, 13 Drawing Sheets

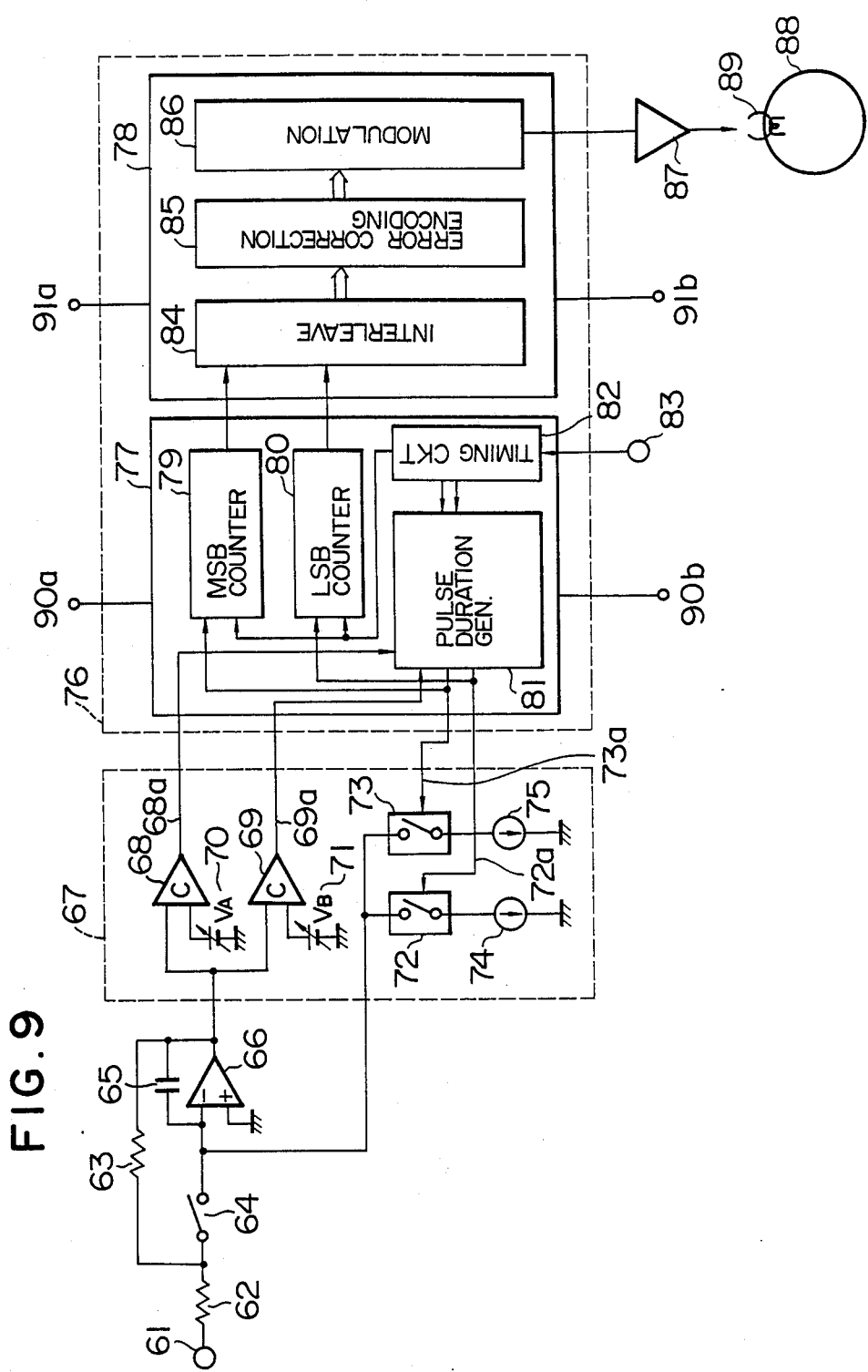

CURRENT SWITCH DURATION = To + Td1 + Td2
DISPERSION OF COMPARISON REFERENCE LEVEL; ΔTd1+ΔTd2

SIGNAL PROCESSING CIRCUIT

BACKGROUND OF THE INVENTION

The present invention relates to a digital-to-analogue (D/A) converter and an analogue-to-digital (A/D) converter. More particularly, the present invention concerns a signal processing circuit such as pulse duration generating circuit or the like for determining integration time of an integration type D/A converter and A/D converter of low power consumption and improved linearity.

As typical integration type D/A converter and A/D converter employed heretofore in the digital audio-signal recording/reproducing apparatus, there can be mentioned those disclosed in Japanese Patent Application Laid-Open Nos. 99821/1982 and 197910/1982 (JP-A-5799821 and JP-A-57-197910). More specifically, Japanese Patent Application Laid-Open No. 99821/1982 discloses an integration-type 16-bit D/A converter in which currents of two constant current sources weighted in the ratio of 1 to $2^8$ are charged in a capacitor constituting a part of integrator for periods corresponding to data placed in an eight more significant bit (MSB) counter and an eight less significant bit (LSB) counter, respectively, to derive an analogue output signal. Assuming, for example, that the sampling period is 20 $\mu$sec (sampling frequency $=50$ KHz), the time T taken for conversion is 10 $\mu$sec and that the number N of bits is equal to eight, the clock frequency f required for the counter is given by $$f = \frac{2^N - 1}{T} = \frac{2^8 - 1}{10 \, (\mu\text{sec})} = 25.5 \, (\text{MHz}) \tag{1}$$

Thus, the D/A converter can be realized in the form of a monolithic IC. Further, by dividing the input data into three or more parts, the clock frequency required for the counters can be further decreased.

On the other hand, Japanese Patent Application Laid-Open No. 197910/1982 discloses an integration type 16-bit A/D converter in which two current sources of current values weighted in the ratio of 1 to $2^7$ are provided in correspondence with nine more significant bits and seven less significant bits, respectively, wherein an analogue value sampled at an integrator element is roughly discharged with the current weighted "$2^7$", being followed by the discharge with the current weighted "1", while counting the time taken for the discharge, to thereby obtain 16-bit digital data. The clock frequency f required for the counter is about 50 MHz on the assumption that the sampling period is about 20 $\mu$sec. With this arrangement, the A/D converter can be realized in a monolithic IC structure. By providing more than two weighted current sources and counters, respectively, the clock frequency required for the counter can be further decreased.

In conjunction with implementation of the D/A converter and A/D converter, bipolar process is suited for realizing the current source circuits and current switch circuits constituting parts of the converters in respect to attainable high accuracy, low noise and high speed. In that case, however, when implementation in the monolithic IC is prerequisite, the counters must be constituted by using logic elements such as ECL (emitter-coupled logic) or the like of large scale and high power consumption. In this conjunction, no consideration is paid to the power consumption in the hitherto known techniques.

Further, since the current value of the current source for the more significant bit data is 256 times (128 times in the case of the A/D converter) as large as that of the current source for the less significant bit data, there is produced error when the signal for controlling the periods of charge and discharge is deviated due to the switching jitter. In the case of the D/A converter, the permissible value of jitter is $$\frac{1}{25 \, (\text{MHz})} \cdot \frac{\pm 0.5}{256} = \pm 78 \, (\text{psec})$$

on the assumption that the clock frequency is 25 MHz.

It is observed that the output linearity of the A/D and D/A converters implemented in IC undergoes degradation due to the jitter of the counter clock signal. FIG. 14 of the accompanying drawings illustrates graphically a relation between the clock jitter and S/N ratio. More specifically, this figure illustrates a modulation degree versus S/N characteristic of an integration type D/A converter in which the clock signal is frequency-modulated. As will be seen in the figure, a curve 33 of $-6$ dB/oct is obtained, which means that S/N ratio (and hence dynamic range) is degraded due to the clock jitter.

SUMMARY OF THE INVENTION

The hitherto known D/A and A/D converters suffer problems that no consideration is paid to the power consumption and attempt of implementation with low power consumption encounters difficulty because the ECL circuits are used as elucidated above.

Accordingly, an object of the present invention is to provide an integration type D/A and A/D converters which can enjoy advantages of improved linearity and low power consumption.

The above object can be accomplished by implementing through complementary MOS process (CMOS process) the ECL logic circuits such as counters and others which consume a major part of electric power supplied to the D/A or A/D converter. More specifically, current source circuits, current switch circuits and comparator circuits of the integration type A/D converter are realized in IC through bipolar proces which can ensure high accuracy and low noise, while the logic parts such as counters are realized through complementary MOS or CMOS process.

More specifically, in view of the fact that at least an error detection/correction circuit and an error concealment circuit are required for supplying input data to a D/A converter and these circuits can be realized in CMOS IC of lower power consumption as compared with the ECL and that the switching jitter of the pulse duration (width) generating circuit of the D/A converter is ascribable to non-uniformity of power supply conductors constituting the power supply source for the counter, it is proposed in an exemplary embodiment of the present invention that the pulse duration generating circuit is realized on one and the same semiconductor substrate integrally with the error detection/correction circuit and the error concealment circuit and that the wired conductors providing a power source to the error detection/correction circuit and the error concealment circuit, respectively, are separated from those providing a power source to the pulse duration generating circuit. With this arrangement, the power consumption can be significantly reduced while the current switch control signals scarcely suffering the jitter are made available, whereby D/A conversion output signal enjoying a much improved linearity can be produced.

BRIEF DESCRIPTION OF THE DRAWINGS

FIG. 9 shows in a block diagram a circuit configuration of a further embodiment of the invention applied to an A/D converter;

DESCRIPTION OF THE PREFERRED EMBODIMENTS

Now, the present invention will be described in detail with reference to the accompanying drawings.

Figure 1:
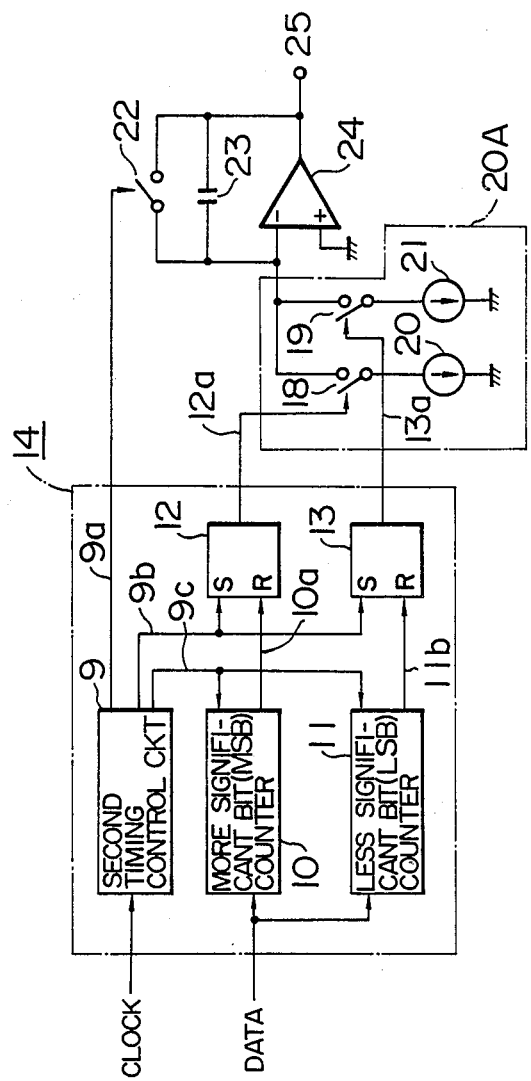
FIG. 1 is a view showing in a block diagram an exemplary embodiment of the signal processing circuit for a D/A converter according to the invention.

FIG. 1 shows in a block diagram a signal processing circuit for a digital-to-analogue (D/A) converter according to an exemplary embodiment of the present invention. Referring to FIG. 1, a reference numeral 9 denotes a timing control circuit, 10 denotes a counter (MSB counter) to be loaded with more significant data bits of input data for the counting thereof, 11 denotes a counter (LSB counter) to be loaded with less significant data bits of the input data for the counting thereof, and 12 and 13 denote RS flip-flops, respectively. The timing control circuit 9, the counters 10 and 11 and the RS flip-flop 12 and 13 cooperate to constitute a pulse duration generating circuit in the form of a CMOS IC circuit denoted generally by a reference numeral 14. Reference numerals 18 and 19 denote analogue switches, and 20 and 21 denote constant current supply sources, respectively. The analogue switches 18, 19 and the constant current supply sources 20 and 21 are implemented in a bipolar integrated circuit or IC generally denoted by a numeral 20A. Further, a reference numeral 22 denotes an analogue switch, 23 denotes a capacitor, 24 denotes an operational amplifier and a numeral 25 denotes an output terminal.

Upon operation of the circuit arrangement shown in FIG. 1, the input data of 16 bits is halved into eight more significant bits and eight less significant bits which are loaded into the counters 10 and 11, respectively, while the RS flip-flops 12 and 13 are set. After having been loaded, the more significant counter 10 and the less significant counter 11 perform the counting operation, whereby the RS flip-flops 12 and 13 are reset when the counted values of the counters 10 and 11 have attained a predetermined value. Thus, pulse signals 12a and 12b having time durations (width) which are in proportion to the magnitudes of the halved input data can be derived. The switches 18 and 19 are controlled by the pulse signals 12a and 12b to allow the current to be supplied to the capacitor 13 from the constant current sources 20 and 21 whose current values are weighted in the ratio of 1 to $2^8$. Immediately before the current supply to the capacitor 13, the switch 22 is closed to discharge electric charges accumulated in the capacitor 13, which is then followed by the integrating operation. In this manner, an analogue signal corresponding to the input data can be obtained at the output terminal 25.

Next, an application of the D/A converter according to the illustrated embodiment of the invention will be described in conjunction with a compact disk (hereinafter referred to as CD) player, by way of example. Concerning the digital signal format for the CD, description is found in a Japanese literature titled "Introduction to CD Player" published by Corona Company, (July 20, 1983), p.p. 129–136. More specifically, an analogue signal is quantized into 16 bits by sampling the analogue signal at a sampling frequency of 44.1 KHz and subsequently undergoes processing such as interleave, addition of error detection/correction code, EFM modulation and the like.

Figure 2:
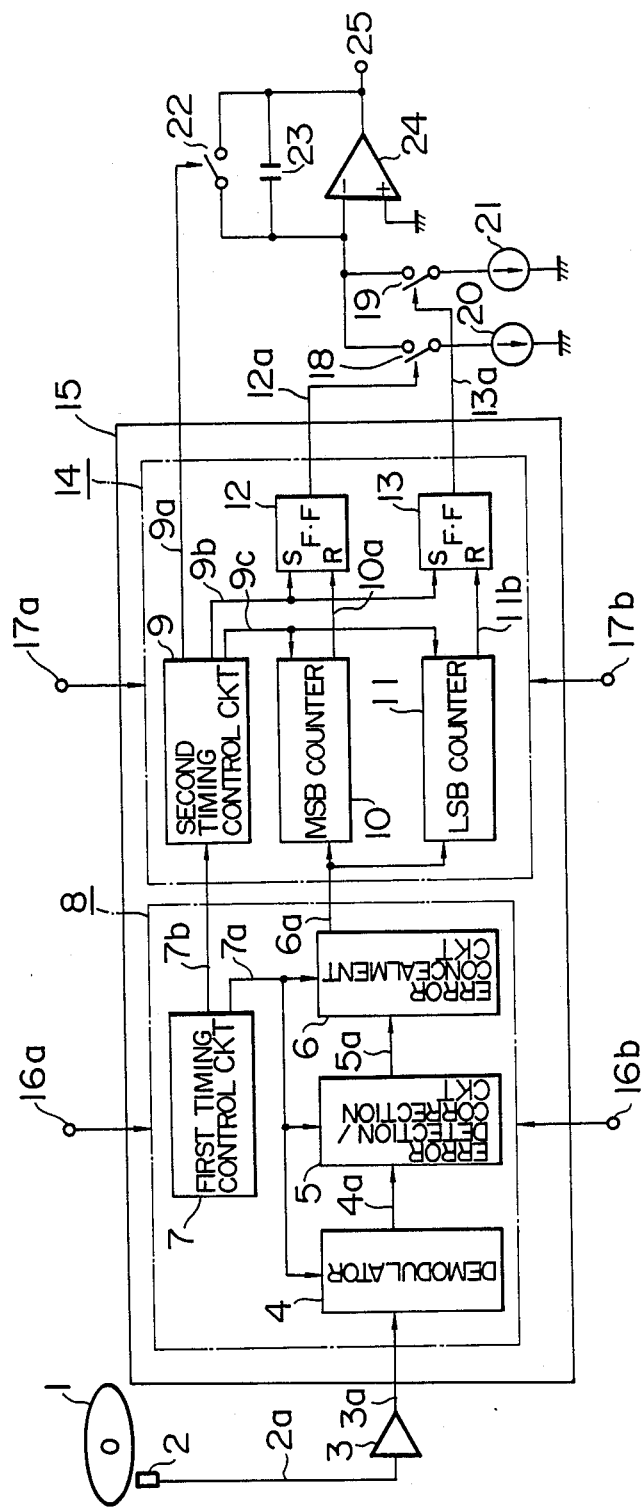
FIG. 2 is a view showing a general arrangement of a compact disk (CD) player in which the signal processing circuit shown in FIG. 1 is employed.

FIG. 2 shows in a block diagram an exemplary embodiment of the signal processing circuit according to the invention designed to be employed in a CD player. In the figure, a reference numeral 1 denotes a disk, 2 denotes a laser pick-up, 3 denotes a preamplifier, and 8 denotes a signal processing circuit composed of a demodulation circuit 4, an error detection/correction circuit 5, an error concealment circuit 6 and a first timing control circuit 7. A reference numeral 14 denotes a pulse duration generating circuit which is constituted by a second timing control circuit 9, a MSB counter 10, a LSB counter 11 and RS flip-flops 12 and 13. Further, a numeral 15 denotes a semiconductor substrate, 16a and 16b denote first power supply sources, 17a and 17b denote second power supply sources, 18 and 19 denote switches, 20 and 21 denote constant current sources, 22 denotes a switch, 23 denotes a capacitor, 24 denotes an operational amplifier and a numeral 25 denotes an output terminal.

Referring to FIG. 2, a signal 2a read out from the disk 1 through the laser pick-up 2 is converted into a digital signal 3a through the preamplifier 3 to be inputted to the demodulation circuit 4, where the digital signal 3a gets rid of modulations such as the EFM, interleave and other to be produced as an output signal 4a which is then supplied to the error detection/correction circuit 5 to undergo the error detection and correction. The output signal 5a of the error detection/correction circuit 5 is inputted to the error concealment circuit 6 which passes therethrough the data free of error as well as the corrected data as they are, while concealing the error of data which could not be corrected by the circuit 5. The error concealment circuit 6 thus produces as the output signal thereof a 16-bit data signal 6a, which is then divided into eight more significant bits and eight less significant bits to be loaded into the MSB counter 10 and the LSB counter 11, respectively, while the RS flip-flops 12 and 13 are simultaneously set. The MSB counter 10 and the LSB counter 11 perform counting operation after having been loaded as mentioned above. At the time points when the counted values have attained a predetermined value, the associated RS flip-flops are reset, whereby pulse signals 12a and 13a having time durations proportional to the magnitudes of the data resulting from the by-two division of the output data of the error concealment circuit 6 are derived. In response to the signals 12a and 13a, the switches 18 and 19 are closed, respectively, to allow the current to be supplied to the capacitor 23 from the constant current sources 20 and 21 whose currents are weighted in the ratio of 1 to $2^8$. Immediately before the current supply to the capacitor 23, the switch 22 is closed to discharge electric charges accumulated in the capacitor 23. In this way, an analogue signal can be obtained at the output terminal 25 of the operational amplifier 24. The first timing control circuit serves to perform the timing control for the demodulation circuit 4, the error detection/correction circuit 5, the error concealment circuit 6 and the second timing control circuit 9, while the latter serves to control the timing of the MSB counter 10, the LSB counter 11, the RS flip-flops 12 and 13 and the switch 22 in response to a data identification signal 7b produced by the first timing control circuit 7.

It should be noted that both the signal processing circuit 8 and the pulse duration generating circuit 14 are implemented on one and the sam semiconductor substrate 15 and that the signal processing circuit 8 is supplied with electric power through the first power supply conductors 16a and 16b, while the pulse duration generating circuit 14 is supplied with electric power by way of the second power supply conductors 17a and 17b.

With the arrangement mentioned above, it is possible to protect the pulse duration generating circuit 14 from mutual interference otherwise produced in operation of the signal processing circuit 8, while switching jitter of the pulse signals 12a and 13a for controlling the switches 18 and 19 can be reduced. As a result, there can be produced an analogue signal having an improved linearity. Further, by realizing the signal processing circuit 8 and the pulse duration generating circuit 14 in the form of CMOS IC, power consumption can be significantly reduced.

Figure 3A:
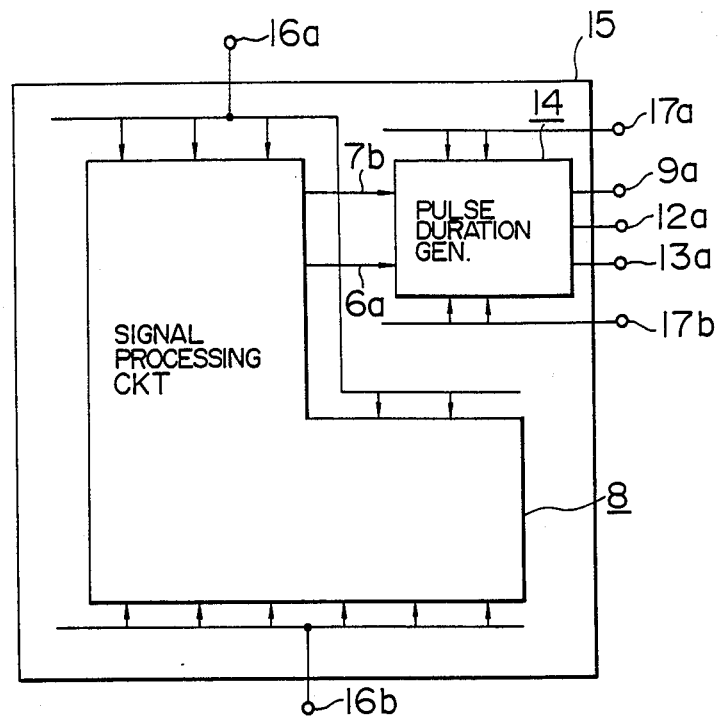
FIGS. 3A and 3B are views showing layouts of the circuit of FIG. 2 realized on a semiconductor substrate.
Figure 3B:
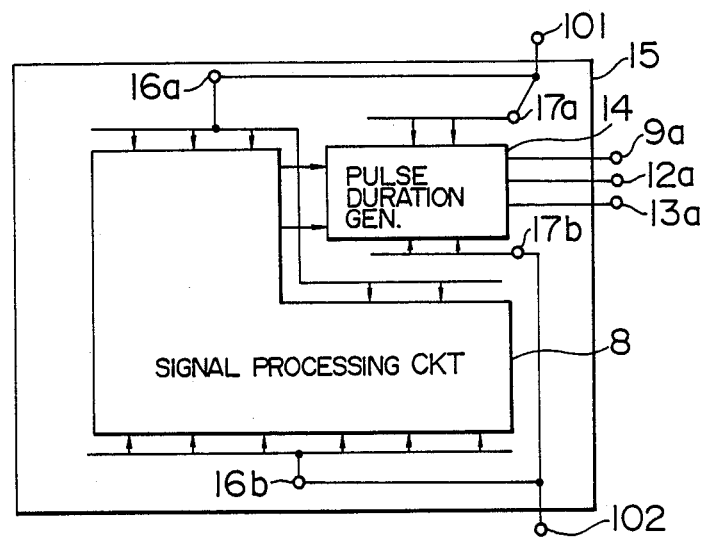

FIG. 3A shows an embodiment of the invention in which the signal processing circuit 8 and the pulse duration generating circuit 14 are implemented on a same semiconductor substrate 5, wherein like components as those shown in FIG. 2 are denoted by the like reference symbols. It will be seen that the signal processing circuit 8 and the pulse duration generating circuit 14 integrated on the semiconductor substrate 15 are separately provided with the first power supply wirings or conductors 16a and 16b and the second power supply conductors 17a and 17b independent of each other, wherein common impedance of the power supplies is lowered. Further, the output conductors 9a, 12a and 13a of the pulse duration generating circuit 14 are disposed between the second power supply conductors 17a and 17b with a view to suppressing the influence otherwise produced by the operation of the signal processing circuit 8. Of course, the first and second power supply conductors are not necessarily led out separately or independently to respective pins of the integrated circuit but may be connected to respective common pins 102 and 103 with common impedance being decreased, as is illustrated in FIG. 3B, to substantially same effects.

Figure 4:
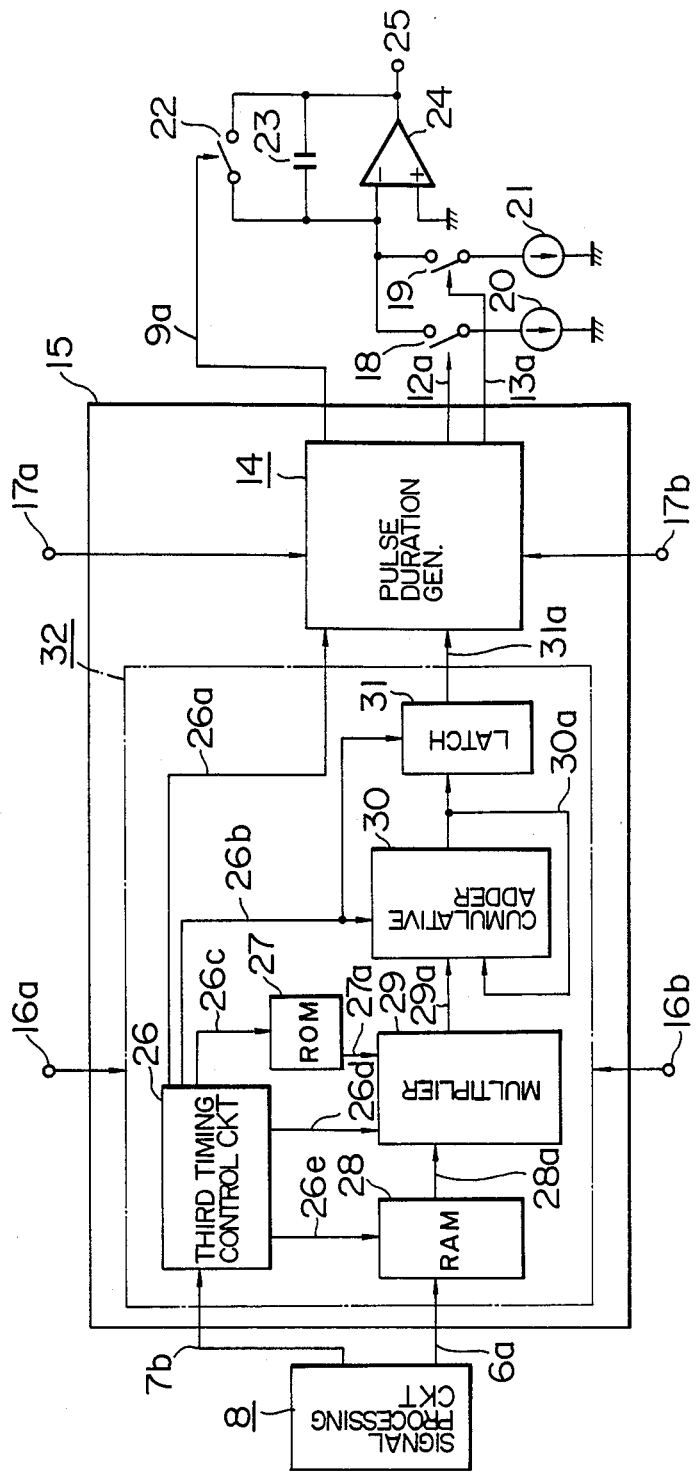
FIG. 4. is a view showing in a block diagram another embodiment of the invention.

FIG. 4 shows another embodiment of the signal processing circuit according to the invention applied to another type of CD player. In FIG. 4, like elements as those shown in FIG. 2 are denoted by like reference numerals. Referring to FIG. 4, a numeral 32 denotes a digital filter circuit which is composed of a third timing control circuit 26, a read-only memory or ROM 27, a random access memory or RAM 28, a multiplier circuit 29, a cumulative addition circuit 30 and a latch 31. The 16-bit data 6a outputted from the signal processing circuit 8 is written in the RAM 28. Data 28a read out sequentially from the RAM 28 is multiplied with a factor 27a read out from the ROM 27 through the multiplier circuit 29, resulting in a signal 29a representative of the result of multiplication. The cumulative addition circuit 30 adds the output 30a thereof to the product data 29a outputted by the multiplier circuit 29. By holding the output 30a of the cumulative addition circuit 30 in the latch 31 with the accumulative addition circuit 30 being reset immediately before performing the cumulative addition, a filter output 31a of 16 bits can be obtained at the output of the latch 31. The pulse duration generating circuit 14 produces at the output the pulse signals 12a and 13a having time durations proportional, respectively, to the magnitudes of the eight more significant bit data and the eight less significant bit data resulting from the division of the output data 31a of the filter circuit 32, whereby an analogue signal is produced at the output terminal 25, as in the case of the signal processing circuit shown in FIG. 2. The third timing control circuit 26 is supplied with a data identification signal 7b as the input signal thereto for controlling the RAM 28, the multiplier circuit 29, the ROM 27, the cumulative addition circuit 30 and the latch 31 and produce as the output signal the filter output identification signal 26a which is then applied to the pulse duration generating circuit 14.

It should be noted that the digital filter circuit 32 and the pulse duration generating circuit 14 are implemented on one and the same substrate 15 in the integrated circuit configuration, wherein the first power supply conductors 16a and 16b supply electric power to the digital filter circuit 32, while the second power supply conductors 17a and 17b supply electric power to the pulse duration generating circuit 14.

Figure 5:
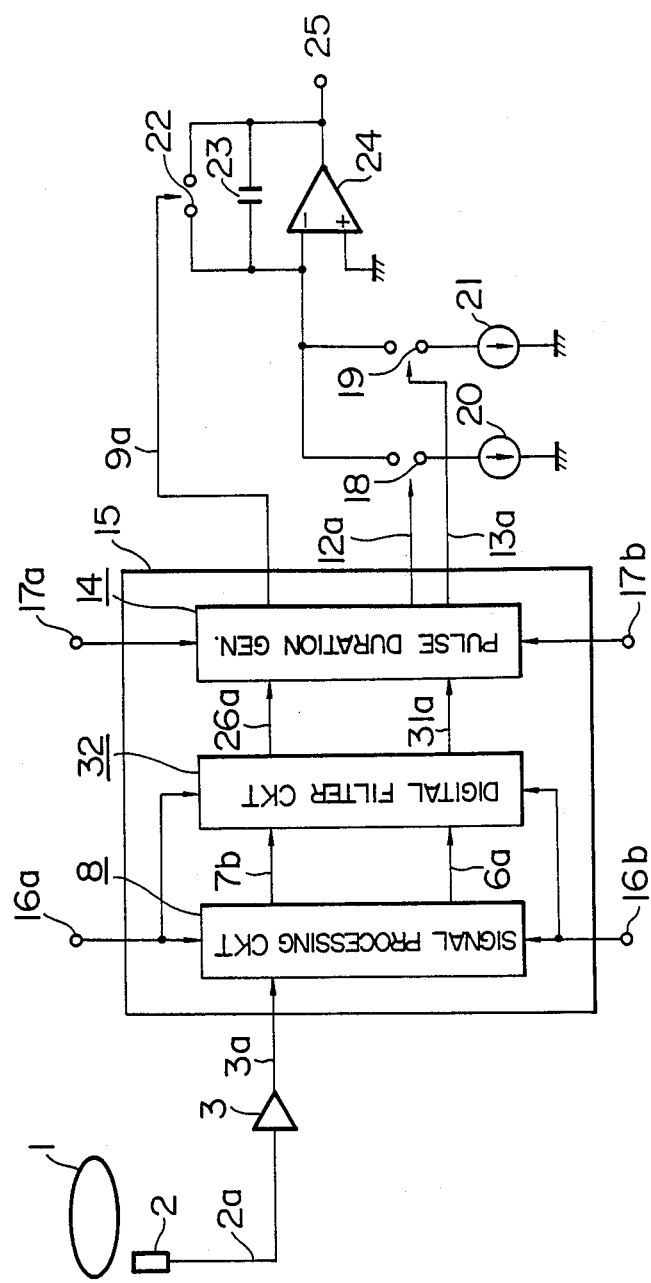
FIG. 5 shows in a block diagram still another embodiment of the invention.

FIG. 5 shows a further embodiment of the present invention, in which like elements as those shown in FIGS. 2 and 4 are denoted by like reference symbols. In the case of the instant embodiment, the signal processing circuit 8, the digital filter circuit 32 and the pulse duration generating circuit 14 are realized on one and the same substrate, wherein the first power supply conductors 16a and 16b supply electric energy to the signal processing circuit 8 and the digital filter circuit 32, while the second power supply conductors 17a and 17b serve to supply electric power to the pulse duration generating circuit 14.

With the arrangement described above, the mutual interference to which the pulse duration generating circuit 14 may otherwise be subjected to upon operation of the signal processing circuit 8 and the digital filter circuit 32 is suppressed, while the pulse signals 12a and 13a for controlling the switches 18 and 19 can be protected against the switching jitter, thus ensuring the analogue signal exhibiting an improved linearity. Further, by implementing the signal processing circuit 8, the digital filter circuit 32 and the pulse duration generation circuit 14 in the form of CMOS IC, the power consumption can be significantly reduced.

In the foregoing description of the various embodiments of the invention shown in FIGS. 1, 2, 4 and 5, it has been assumed that the data is halved into eight more significant bits and eight less significant bits. However, the data can be divided into three parts. For example, sixteen-bit data may be divided into the five less significant bits, five medium bits and the six more significant bits. In this case, there are required three constant current supply sources whose current values may be weighted in the ratio of $1:2^5:2^{10}$ where the base "1" is for the current source associated with the five less significant bits.

Figure 6:
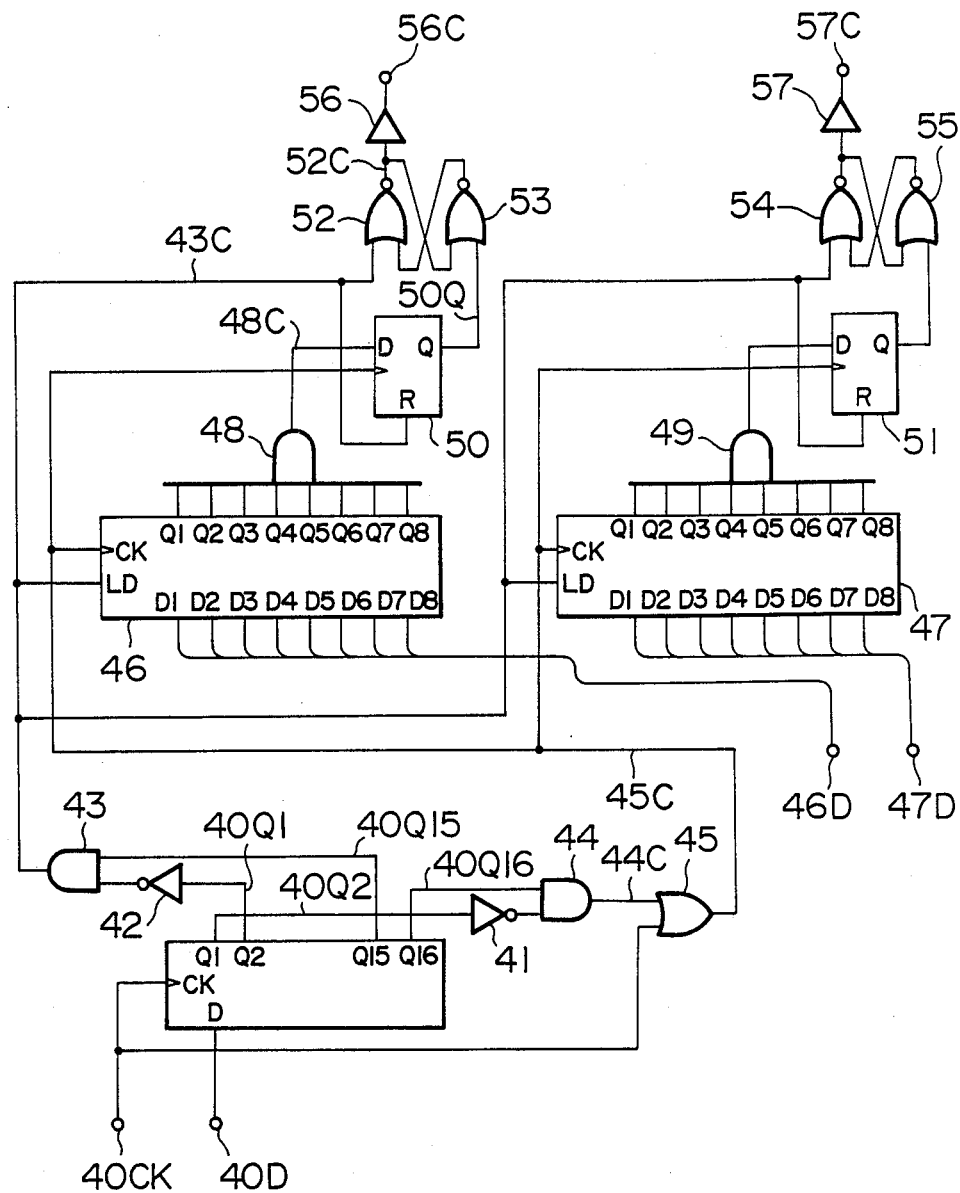
FIG. 6 is a view showing a configuration of a pulse duration generating circuit.
Figure 7:
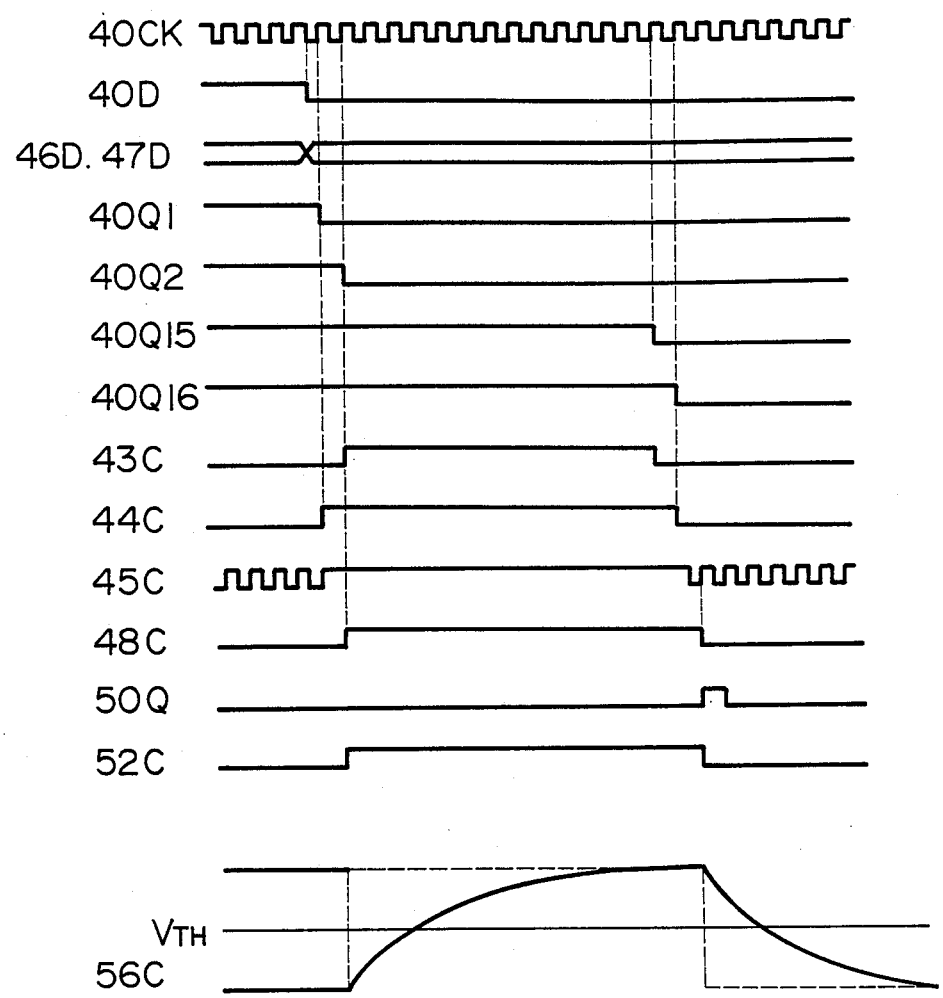
FIG. 7 and FIGS. 8A and 8B are waveform diagrams for illustrating operation of the circuit shown in FIG. 6.

FIGS. 6 and 7 show an embodiment of the pulse duration generating circuit according to the invention which contributes to further enhancing the audio performance of the apparatus shown in FIGS. 2, 4 and 5. More specifically, FIG. 6 shows the circuit configuration of the pulse duration generating circuit, and FIG. 7 is a waveform diagram illustrating operations of various components of the circuit shown in FIG. 6.

Referring to FIG. 6, a reference symbol 40 denotes a shift register of sixteen stages, 40CK denotes a clock input terminal to which a clock signal is applied for performing pulse duration conversion, 40D denotes an input terminal for the data identification signal, 41 and 42 denote inverter circuits, 43 and 44 denote AND circuits, 46 and 47 denote load counters, 46D and 47D denote input terminals for 16-bits data, 48 and 49 denote AND circuits, 50 and 51 denote flip-flop circuits, 52 to 55 denote NOR circuits, and finally numerals 56 and 57 denote buffer circuits, respectively. In FIG. 7, numeric symbols in the leftmost column represent corresponding signals indicated by the same symbols in FIG. 6.

Now, operation of the circuit shown in FIG. 6 will be described with the aid of the signal waveform diagrams shown in FIG. 7.

The basic clock input terminal 40CK is supplied with a clock signal of about 25 MHz in accordance with the expression (1) for performing the pulse duration conversion. The data identification signal and the data signals are applied to the respective terminal in synchronism with the falling edge of the clock 40CK, as will be seen in FIG. 7 at rows 40D, 46D and 47D. The shift register 40 shifts the data identification signal in response to the clock pulses 40CK to thereby produce timing signals 40Q1, 40Q2, 40Q15 and 40Q16 illustrated in FIG. 7 at the corresponding outputs of the first, second, fifteenth and the sixteenth stages, respectively. These signals are decoded by the inverter circuits 41 and 42 and the AND circuits 43 and 44, whereby the pulses 43C and 44C are produced with delays relative to the falling edge of the data identification signal 40D, as illustrated in FIG. 7. The pulse widths or durations of these pulses 43C and 44C are determined in dependence on the number of stages of the shift register 40. The output pulse signal 43C of the AND circuit 43 serves to enable the data loading and at the same time reset the flip-flop circuits 50 and 51 as well as a RS flip-flop constituted by the NOR circuits 54 and 55. On the other hand, the output signal of the AND circuit 44 enables the OR circuit 45 to gate the clock signal 40CK. The output signal of the OR circuit 45 assumes the waveform illustrated at 45C in FIG. 7.

Figure 8A:
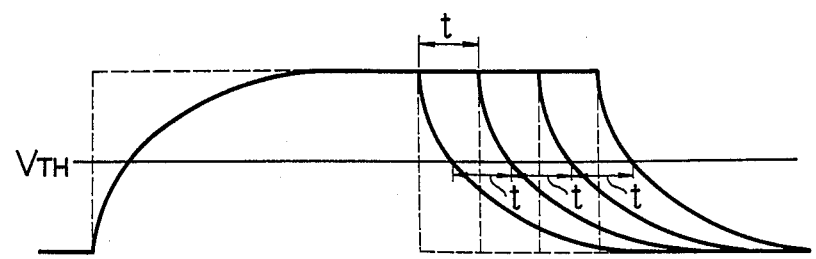
Figure 8B:
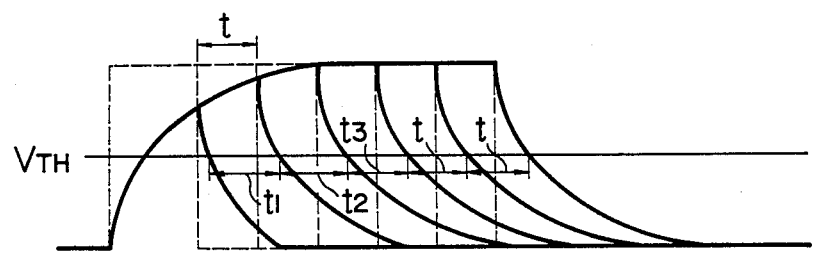

The data 46D and 47D each of eight bits are loaded in the counters 46 and 47, respectively, in response to the output signal 43C of the AND circuit 43, the counting operations of these counters being triggered by the clock signal 45C outputted from the OR circuit 45. When the AND circuit 48 detects that the output pulses of the counter 46 are all at the level "1", the flip-flop circuit 50 inhibits hazard and allows a pulse signal to be supplied to the NOR circuit 53. Since the NOR circuits 52 and 53 constitute a RS flip-flop, the NOR circuit 52 produces an output signal 52C having a pulse duration spanning the output pulse 43C of the AND circuit 43 and the output pulse 50Q of the flip-flop 50. In this manner, the time required for all the contents of the counter 46 to assume "1" is controlled in dependence on the data applied to the terminal 46D, resulting in the corresponding pulse duration signal generated at the output terminal 56C, as illustrated in FIG. 7 at 56C. In a similar manner, a pulse duration signal controlled by the data 47D is produced at the output terminal 57C through similar operation. It is now assumed that data of all "1's" is applied to the terminal 46D. On the assumption, when the pulse 43C outputted by the AND circuit 43 and serving as the load pulse for enabling the counter 46 to be loaded with the data 46D becomes "1", the output signal 48C of the AND circuit 48 serving to decode the output of the counter 46 assumes the level "1". However, since the clock signal 45C for the counter 46 and the flip-flop 50 remains unchanged, no pulse is applied to the NOR circuit 53, as the result of which the output 52C of the NOR circuit 52 is held at the level "1". This output signal 52C continues to be at the level "1" till the time point at which the clock pulse 45 rises up, whereupon the output signal 52C assumes the level "0". Accordingly, the minimum pulse duration of the output signal 52C is determined to be equal to the time span from the rise-up of the output pulse 43C to the first rise-up of the clock 45C. In the case of the instant embodiment, the pulse duration corresponding to 16 clock pulses of the clock signal 40CK is defined as the minimum pulse width. Thus, the constant current supply sources can be switched with the output signal 56C of the buffer 56 while maintaining the pulse duration to be constant even when the output waveform varies exponentially due to the load capacitance of the buffer 56 as illustrated at 56C in FIG. 7. FIGS. 8A and 8B are views for graphically illustrating the change in the duration of the pulse for switching the constant current sources in the case where the minimum pulse duration of the converted pulse duration output signal 56C is definitely regulated by the waveform of the buffer 56, comparatively with the case where the minimum pulse duration is not regulated. More specifically, FIG. 8A illustrates the case where the pulse duration is regulated as mentioned above, while FIG. 8B illustrates the case where the pulse duration undergoes no regulation and thus the pulse falls before rising up completely. In FIGS. 8A and 8B, the pulse duration varies from the minimum pulse duration by an amount corresponding to the data at the period t of the clock signal 40CK (FIG. 6). In the case of the example shown in FIG. 8A, the pulse falls only after rising up completely, whereby the duration t of the pulse is maintained at the threshold level $V_{TH}$ even when the waveform changes exponentially. On the other hand, in the case shown in FIG. 8B where the pulse falls on the way of rising up, the pulse duration is deviated from the period t and changes as indicated by $t_1$, $t_2$ and $t_3$. As will now be appreciated, the embodiment shown in FIG. 6 can provide a pulse duration generating circuit exhibiting excellent linearity by virtue of such arrangement that the minimum pulse duration is definitely determined.

Next, an A/D converter according to an embodiment of the invention will be described. FIG. 9 is a circuit diagram of a recording system of a digital tape recorder (also referred to as DAT) in which the A/D converter according to the invention is employed. In FIG. 9, a reference numeral 61 denotes an audio signal input terminal, 62 and 63 denote resistors, 64 denotes a sample and hold switch, 65 denotes an integrating capacitor, and 66 denotes an operational amplifier. These elements 62 to 66 constitute a sample and hold circuit and an integrating circuit for the A/D conversion. A block 67 represents a linear portion of the A/D converter implemented in the form of bipolar IC, wherein reference numerals 68 and 69 denote comparators, 70 and 77 denote reference voltage sources for comparators 68 and 69, respectively, 75 denotes a current supply weighted at $2^7$, numeral 74 denotes a current supply source weighted at "1", and 73 and 72 denote current switches for turning on and off the currents of the current supplies 75 and 74, respectively. A block 76 represents a LSI realized on the same semiconductor substrate through CMOS process, in which a numeral 77 generally denotes a logic unit or integrating/counting circuit of the A/D converter which is constituted by a timing circuit 82, a pulse duration generating circuit 81, a counter 79 for counting nine more significant bits, and a counter 80 for counting seven less significant bits. A reference numeral 78 denotes a digital signal processing circuit for the DAT which is constituted by an interleave processing circuit 84, an error correction encoder 85 and a modulation circuit 86. A reference numeral 87 denotes a buffer amplifier for recording data on a tape through a rotary head 89 mounted on a cylinder 88. It should be noted that the A/D converter is constituted by the IC 67 and the integrator/counter circuit 77. Operation is performed similarly to that of the hitherto known A/D converter.

Both the signal processing circuit 78 and the integrator/counter circuit 77 are implemented integrally on one and the same semiconductor substrate, wherein the signal processing circuit 78 is supplied with electric power through first source conductors 91a and 91b, while the integrator/counter circuit 77 are supplied with electric power through second source conductors 90a and 90b.

With this arrangement, interference which the integrator/counter circuit 77 may otherwise suffer due to operation of the signal processing circuit 78 can be suppressed effectively, while the switching jitter of the pulse duration signals 72a and 73a for controlling the current switches 72 and 73 can be reduced, whereby the A/D conversion of an improved linearity can be accomplished. Further, since the signal processing circuit 78 and the integrator/counter circuit 77 are realized through CMOS process, power consumption can be lowered.

Figure 10:
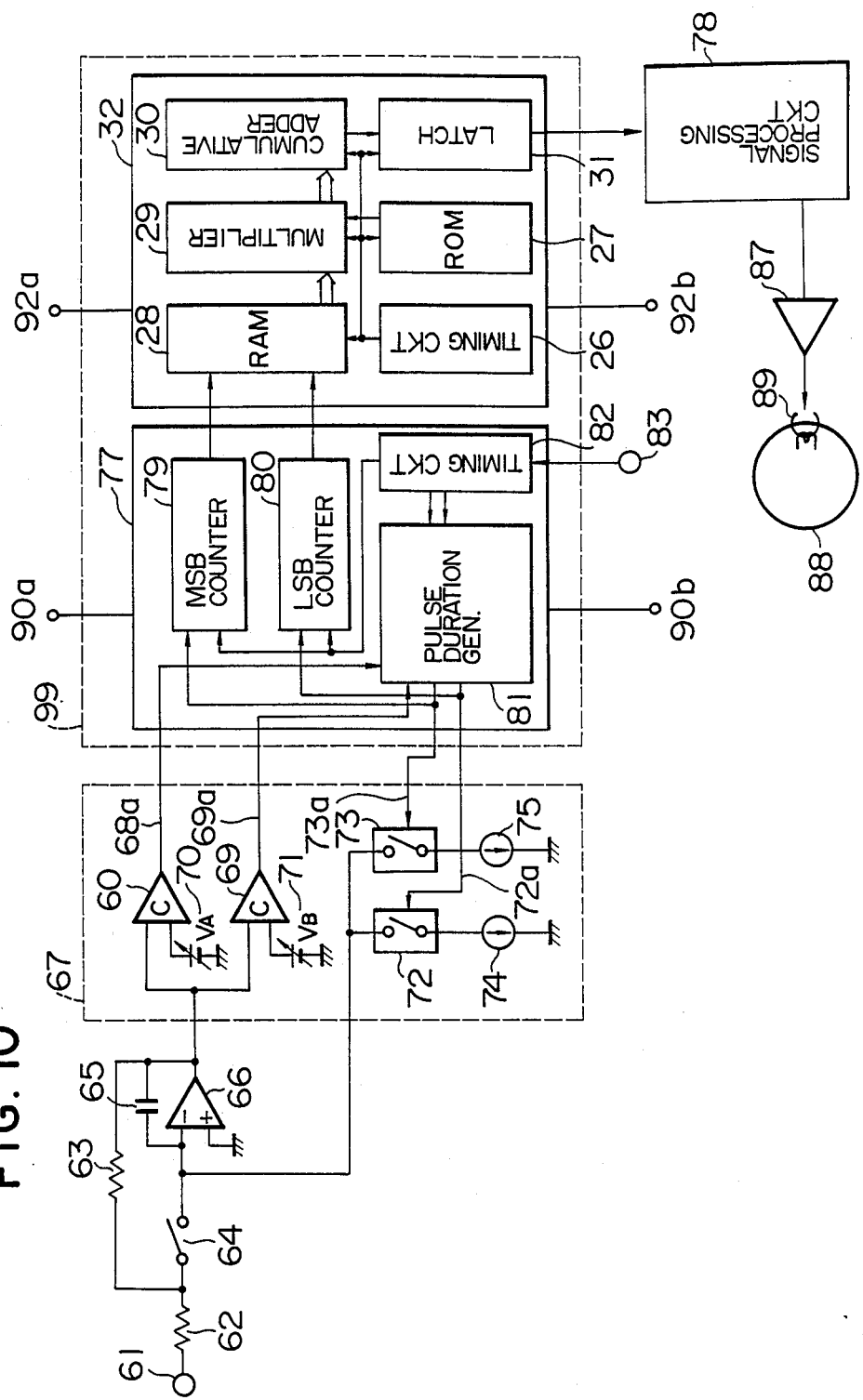
FIG. 10 is a view showing in a block diagram a further embodiment of the invention.

FIG. 10 shows another embodiment of the A/D converter according to the invention. In this figure, same or equivalent elements to those shown in FIGS. 9 and 4 are denoted by same reference symbols as those used in FIGS. 9 and 4. Referring to FIG. 10, a numeral 32 denotes a digital filter processing circuit. The 16-bit data resulting from the A/D conversion is written in the RAM 28. The data read out sequentially from the RAM 28 is multiplied with factor data read out from the ROM 27 through the multiplier circuit 29. The cumulative addition circuit 30 adds the output thereof to the output of the multiplier circuit 49.

By holding the outpu of the cumulative addition circuit 30 in the latch 31 with the circuit 30 being reset immediately before performing the cumulative addition, there can be obtained the filter output of 16 bits at the output of the latch 31. Also in the case of this embodiment, both the digital filter circuit 32 and the integrator/counter circuit 77 are integrated on one and the same semiconductor substrate, wherein the digital filter circuit 32 is supplied with power through the first source conductors 92a and 92b, while the integrator/counter circuit 77 are supplied with power through the second source conductors 90a and 90b.

Figure 11:
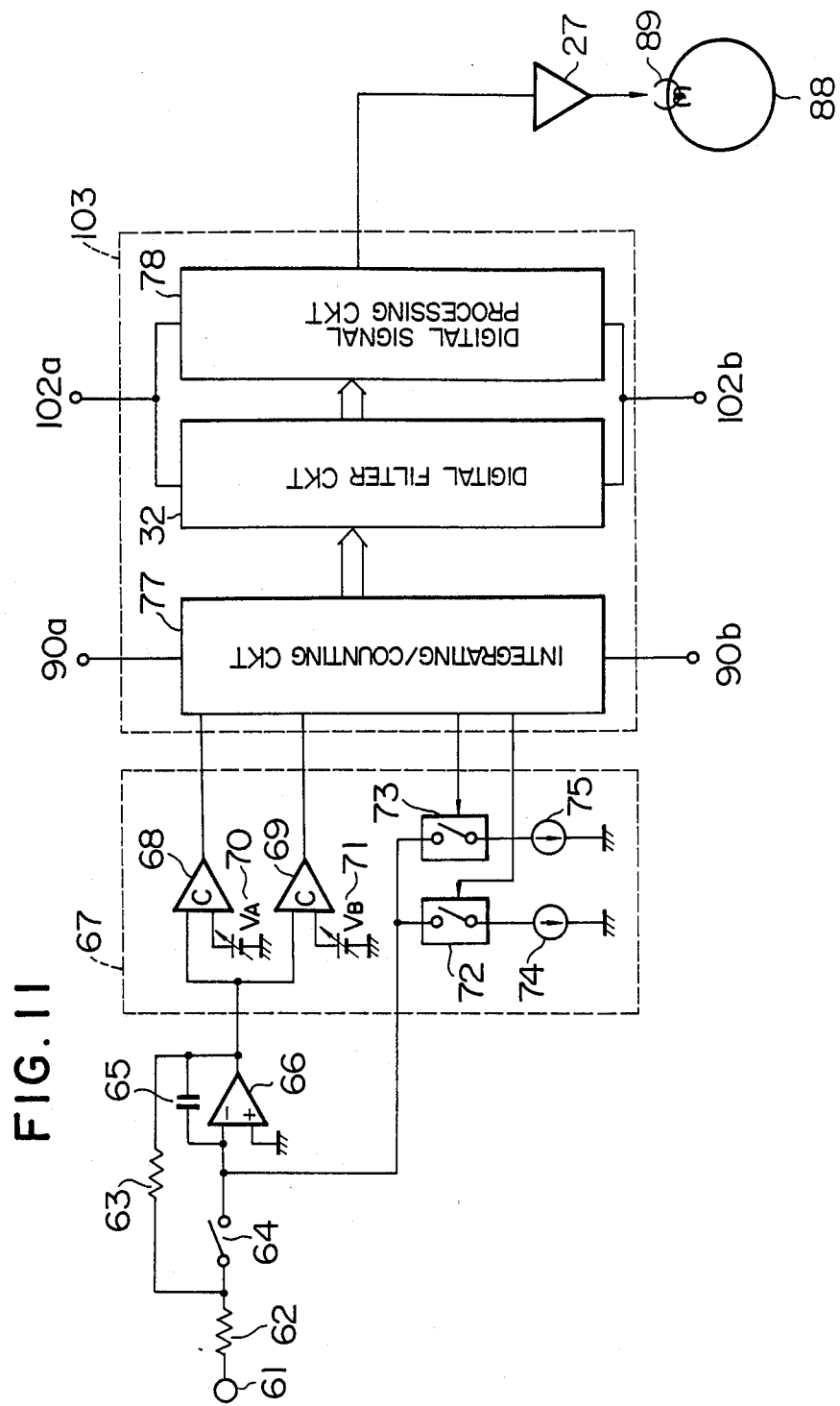
FIG. 11 shows in a block diagram still another embodiment of the invention.

FIG. 11 shows a further embodiment of the present invention, in which like elements as those shown in FIGS. 9 and 10 are denoted by like reference symbols. In the case of this embodiment, the signal processing circuit 78, the digital filter circuit 32 and the integrator/counter circuit 77 are integrated on a same semiconductor substrate, wherein the first source conductors 102a and 102b supply electric power to both the signal processing circuit 78 and the digital filter circuit 32, while the second source conductors 90a and 90b supply electric power to the integrator/counter circuit 77. With this arrangement, interference which the integrator/counter circuit 77 may otherwise suffer upon operation of the signal processing circuit 28 and the digital filter circuit 32 can be effectively suppressed, while the switching jitter of the pulse signals for controlling the switches 72 and 73 can be reduced, whereby the A/D conversion of an improved linearity can be accomplished. Further, by realizing the circuit 103 through CMOS process, the overall power consumption can be lowered.

Figure 12:
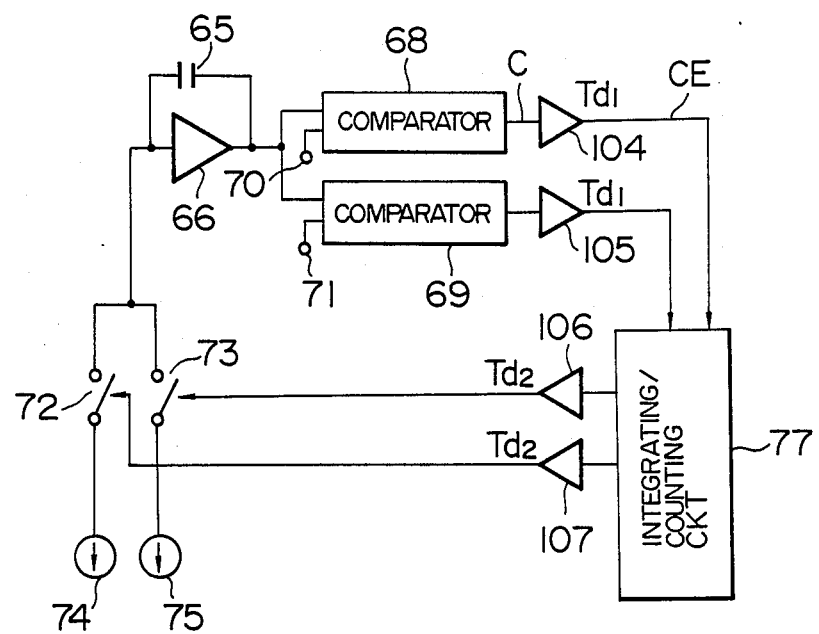
FIG. 12 is a view for illustrating relationship between a signal delay involved in linear par and logic part and reference level for comparison.
Figure 13:
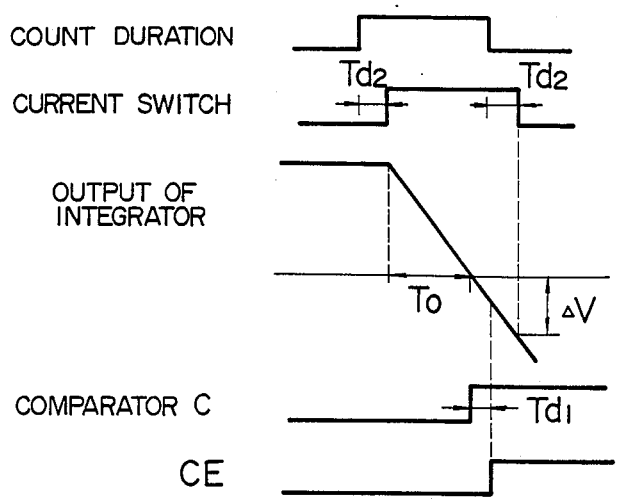
FIG. 13 is a waveform diagram for illustrating operation of the arrangement shown in FIG. 12.
Figure 14:
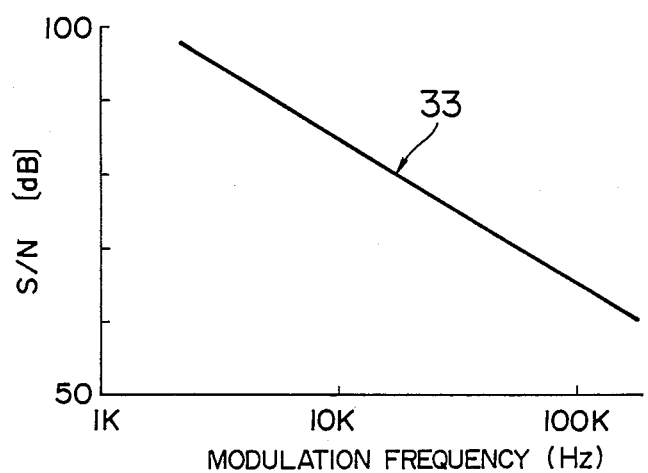
FIG. 14 is a view for illustrating graphically a relationship between clock jitter and S/N ratio.

FIG. 12 is a view for illustrating a relationship between the reference levels 70 and 71 of the comparators 68 and 69, respectively, and signal delay due to interface and wirings provided between a linear part and a logic part of the A/D converter on the assumption that the latter is divided into these parts. When the delay time taken for the output signal of the linear part (i.e. the output of the comparator) to be inputted to the logic circuit is represented by $Td_1$, while the delay time taken for the output signal of the logic circuit to be inputted to the current switch circuit of the linear circuit is represented by $Td_2$, the period during which the current switch is opened is equal to the time taken for the counting operation and given by $T_0+Td_1+Td_2$, as is illustrated in FIG. 13, where $T_0$ represents the time taken inherently for the integration output to attain the reference level. Consequently, the output level of the integrator becomes lower than the inherent reference level for comparison by $\Delta V$ due to the delay $(Td_1+Td_2)$. In other words, when the delay time varies, this means that equivalent change occurs in the reference level for comparison. Accordingly, the reference level for comparison should be determined in the state in which the linear IC and the logic LSI have been mounted and wired. To this end, the reference level (70, 71) for comparison is made adjustable in the case of the embodiments shown in FIGS. 9 to 11.

As will be appreciated from the foregoing description, it is possible according to the teachings of the present invention to implement the D/A and/or A/D converter enjoying an improved linearity and a low power consumption and hence provide a digital signal recording/reproducing apparatus of excellent performance by virtue of such arrangement that mutual interference of the digital signal processing circuit and the integrator/counter circuit can be suppressed even when the integrator/counter circuit comprising the pulse duration generating circuit and the digital signal processing circuit are implemented on one and the same semiconductor substrate, while the switching jitter of the switching signals for controlling a plurality of constant current sources can be reduced.

We claim:

1. A signal porocessing circuit, comprising:
 integrating means including a capacitor for integrating a constant current as a function of time;
 a first circuit constituting pulse duration generating means for determining the integration time;
 a second circuit including at least a current switch circuity for turning on and off the current supplied from current source means in dependence on said integration time;
 said first and second circuits being implemented as integrated circuits separately in respective chips;
 said first circuit being integrated by complementary MOS FET process on a same semiconductor substrate together with at least a digital signal processing circuit constituting error correction processing means for processing a PCM signal; and
 said second circuit being realized through bipolar process.

2. A signal processing circuit, comprising:
 integrating means including a capacitor for integrating a constant current as a function of time;
 a first circuit constituting pulse duration generating means for determining the integration time;
 a second circuit including at least a current switch circuitry for turning on and off the current supplied from current source means in dependence on said integration time;
 said first and second circuits being implemented as integrated circuits separately in respective chips; and
 said first circuit being integrated by complementary MOS FET process on a same semiconductor substrate integrally with a digital signal processing circuit which is constituted at least by multiplication means for multiplying PCM data and cumulative addition means for adding cumulatively the output of said multiplication means.

3. A signal processing circuit comprising:
 integrating means including a capacitor for integrating a constant current as a function of time;
 a first circuit constituting pulse duration generating means for determining the integration time;
 a second circuit including at least a current switch circuitry for turning on and off the current supplied from current source means in dependence on said integration time;
 said first and second circuits being implemented as integrated circuits separately in respective chips; and
 said first circuit being constituted by complementary MOS FETs while said second circuit being realized through bipolar process,
 wherein said integrating means constitutes an A/D converter for converting an analogue signal to a digital signal by discharging an analogue voltage charged in the capacitor with constant currents and counting a clock signal to determine the time take for the charge of said capacitor to attain a predetermined value, said A/D converter including a first circuitry constituting counting means for counting the integration time corresponding to said analogue voltage value with said clock signal, and at least a second circuit composed of a current switch circuitry for turning on and off the current of the current source means in accordance with the integration time, said first and second circuitries being implemented in the form of integrated circuits separately in respective chips, said first circuitry being realized through complementary MOS FET process, while said second circuitry being realized through bipolar process, and
 wherein said first circuitry is integrated on a same semiconductor substrate together with at least a digital signal processing circuit constituting error correction processing means for processing a PCM signal.

4. A signal processing circuit according to claim 3, including at least a first power supply means for supplying electric power to said error correcting means, and second power supply means for supplying electric power to said integration time counting means, to thereby suppress mutual interference between said integration time counting means and said error correcting means.

5. A signal processing circuit according to claim 3, wherein the pulse duration signal generating means for generating a control signal for controlling current switch means for turning on and off the current to be integrated is provided with pulse duration adding means for providing a pulse duration of a predetermined time duration, to preset the minimum pulse duration generated by said pulse duration generating means not shorter than said predetermined time duration.

6. A signal processing circuit comprising:
 integrating means including a capacitor for integrating a constant current as a function of time;
 a first circuit constituting pulse duration generating means for determining the integration time;
 a second circuit including at least a current switch circuitry for turning on and off the current supplied from current source means in dependence on said integration time;
 said first and second circuits being implemented as integrated circuits separately in respective chips; and
 said first circuit being constituted by complementary MOS FETs while said second circuit being realized through bipolar process,
 wherein siad integrating means constitutes an A/D converter for converting an analogue signal to a digital signal by discharging an analogue voltage charged in the capacitor with constant currents and counting a clock signal to determine the time take for the charge of said capacitor to attain a predetermined value, said A/D converter including a first ciruicitry consituting counting means for counting the integration time corresponding to said analogue voltage value with said clock signal, and at least a second cirucit composed of a current switch circuitry for turning on and off the current of the current source means in accordance with the integration time, said first and second circuitries being implemented in the form of integrated circuits separately in respective chips, said first cirucitry being realized through complementary MOS FET process, while said second circuitry being realized through bipolar process, and wherein said first cirucitry is integrated on a same semiconductor substrate integrally with a digital signal processing circuit which is constituted by multiplication means for multiplying output X resulting from the A/D conversion with a multiplier Y to perform operation given by P=X.Y and cumulative addition means for adding cumulatively the output P of said multiplication means.

7. A signal processing circuit according to claim 6, including first power supply means for supplying electric power to said multiplication means and said cumulative addition means, and second power supply means for supplying electric power to said integration time counting means, to thereby supress mutual interference between said multiplication means and cumulative addition means on one hand and said integration time counting means on the other hand.

8. A signal processing circuit according to claim 6, wherein the pulse duration signal generating means for generating a control signal for controlling current switch means for turning on and off the current to be integrated is provided with pulse duration adding means for providing a pulse duration of a predetermined time duration, to preset the minimum pulse duration generated by said pulse duration generating means not shorter than said predetermined time duration.

9. A signal processing circuit comprising:
integrating means including a capacitor for integrating a constant current as a function of time;
a first circuit constituting pulse duration generating means for determining the integration time;
a second circuit including at least a current switch circuitry for turning on and off the current supplied from current source means in dependence on said integration time;
said first and second circuits being implemented as integrated circuits separately in respective chips; and
said first circuit being constituted by complementary MOS FETs while said second circuit being realized through bipolar process,
wherein said integrating means constitutes an A/D converter for converting an analogue signal to a digital signal by discharging an analogue voltage charged in the capacitor with constant currents and counting a clock signal to determine the time take for the charge of said capacitor to attain a predetermined value, said A/D converter including a first circuitry constituting counting means for counting the integration time corresponding to said analogue voltage value with said clock signal, and at least a second circuit composed of a current switch circuitry for turning on and off the current of the current source means in accordance with the integration time, said first and second circuitries being implemented in the form of integrated circuits separately in respective chips, said first circuitry being realized through complementary MOS FET process, while said second circuitry being realized through bipolar process,
said second circuitry including at least a plurality of current sources, a plurality of current switches and a plurality of comparators, wherein reference levels of said comparators being varied in accordance with a total sum of delay time involved in signal transmission from said first circuitry to said second circuitry and delay time involved in signal transmission from said second circuitry to said first circuitry.

* * * * *